United States Patent [19]
Kakimi

[11] Patent Number: 5,640,357
[45] Date of Patent: Jun. 17, 1997

[54] STORAGE DEVICE USING DYNAMIC RAM

[75] Inventor: Toshiaki Kakimi, Kawasaki, Japan

[73] Assignee: Fujitsu Limited, Japan

[21] Appl. No.: 515,104

[22] Filed: Aug. 14, 1995

[30] Foreign Application Priority Data

Dec. 2, 1994 [JP] Japan ................................ 6-299167

[51] Int. Cl.$^6$ ........................................ G11C 13/00
[52] U.S. Cl. ................ 365/229; 365/222; 365/226
[58] Field of Search .............................. 365/222, 226, 365/229, 227

[56] References Cited

U.S. PATENT DOCUMENTS 5,473,576  12/1995  Matsui ...................... 365/227

FOREIGN PATENT DOCUMENTS

| 55-105893 | 8/1980 | Japan . |
| 57-027491 | 2/1982 | Japan . |
| 59-087695 | 5/1984 | Japan . |

OTHER PUBLICATIONS

MOS Integrated Circuit PD42S16400L, 4216400L, 42S17400L, 4217400L Data Sheet (NEC, issued Nov. 1993).

*Primary Examiner*—Terrell W. Fears
*Attorney, Agent, or Firm*—Greer, Burns & Crain, Ltd.

[57] ABSTRACT

A storage device which consumes small amounts of power during self-refreshing. The storage device includes a memory controller which forces a dynamic RAM to start a self-refreshing operation in response to a backup instruction signal. The backup instruction signal is issued when power from a main power source is shut off. During the self-refreshing operation, RAS and CAS signal lines connected to the dynamic RAM are grounded via pull-down resistors so that these signal lines are fixed to an L-level. When electric power is supplied via the main power line, a backup power supply controller directly transfers the electric power received via the main power line to a memory circuit, whereas the backup power supply controller transfers electric power received via the backup power line to the dynamic RAM when the power supply is switched to the backup power line. Upon initial installation of an additional memory module including a dynamic RAM, electric power is supplied first to the dynamic RAM via the backup power line, and electric power supply to the newly installed memory module is inhibited so that no power consumption occurs in the dynamic RAM of the newly installed memory module.

20 Claims, 10 Drawing Sheets

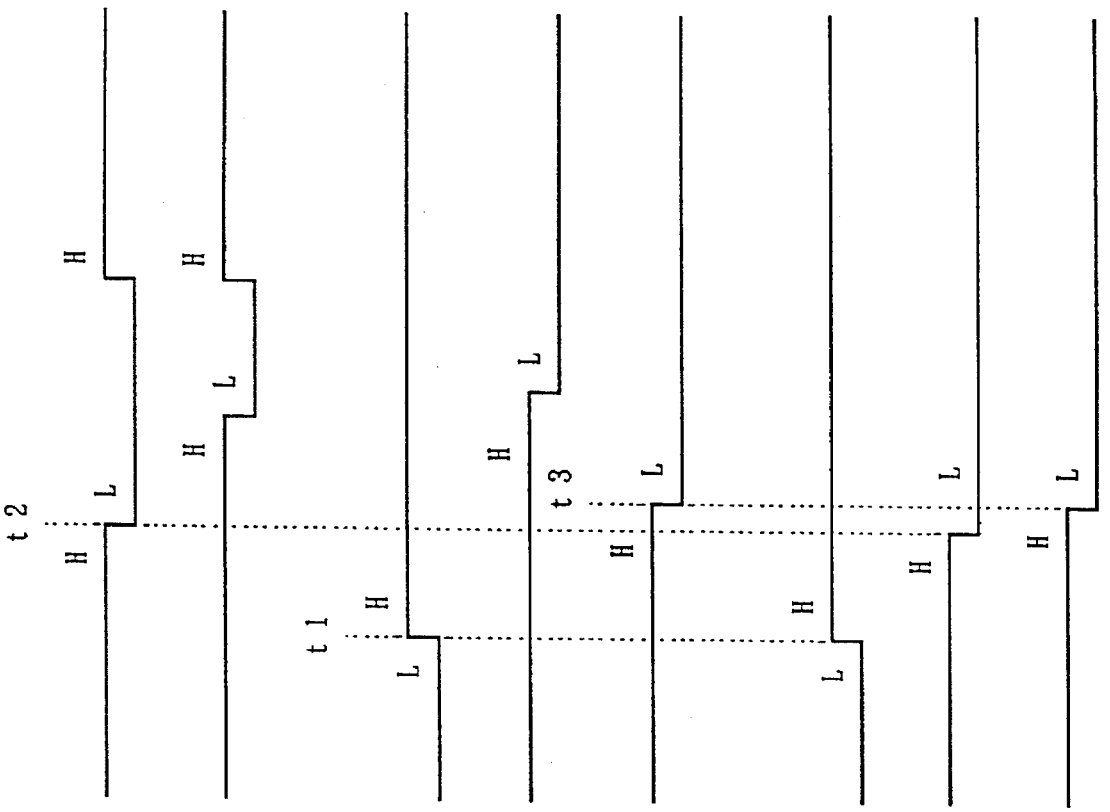

STORAGE DEVICE USING DYNAMIC RAM

BACKGROUND OF THE INVENTION

The present invention relates generally to a storage device using a dynamic RAM. More particularly, the present invention relates to a storage device that preserves the contents of a dynamic RAM by performing a self-refreshing operation when a main power source is shut off, and the storage device operates under a backup power supply.

In conventional storage devices using a dynamic RAM, refreshing is performed during a normal operation so as to maintain the contents of the dynamic RAM. In the refreshing operation, a refresh instruction signal is given by an upper level device to the storage device, and this instruction is interpreted by a memory controller. According to the interpretation result, the memory controller changes in turn CAS (column address strobe) and RAS (row address strobe) signals acting as dynamic RAM control signals to an L-level with predetermined timing. This refreshing operation is known as the CAS-before-RAS refreshing operation.

The refreshing operation usually needs a rather large current such as a few ten mA. When the main power source to the storage device is shut off, backup power is supplied to the dynamic RAM from a backup power source such as a battery, and the data stored in the dynamic RAM is preserved by the self-refreshing capability of the dynamic RAM while consuming as small electric power as static RAMS. In the power backup mode, unlike the normal mode, the self-refreshing for preserving the data in the dynamic RAM is performed in such a manner that the CAS and RAS signals applied to the dynamic RAM are changed in turn to an L-level with predetermined timing and maintained at the L-level for a time period equal to or greater than a predetermined value so that a refreshing circuit in the dynamic RAM starts its operation by which memory cells are refreshed automatically. Both RAS and CAS signals are fixed to the L-level during the refreshing operation.

In this situation, the self-refreshing operation of the dynamic RAM needs a current as low as a few hundred µA, which allows a long-time operation in the power backup mode. The RAS and CAS signal lines have to be maintained firmly at an L-level so that the self-refreshing operation can be performed correctly even at the moment when the main power source of the device is turned on or off. To meet this requirement, in the conventional technique, the backup power is supplied to the whole memory circuit including the controller.

However, unlike the static RAM that can maintain data with very low power consumption, the conventional storage device using a dynamic RAM consume considerable power when the dynamic RAM is refreshed to maintain data in the dynamic RAM, and thus a high-capacity battery is required to achieve a sufficiently long backup. Furthermore, in the conventional technique, the controlling circuit also consumes electric power during the backup operation, which further limits the maximum backup time.

In storage devices of the type in which expansion of the dynamic RAM memory modules is allowed up to a predetermined upper limit, an additional memory module for expansion is installed when the storage device is in a backup mode in which the main power source to the storage device is shut off. However, the memory controlling circuit of the newly installed memory module does not execute a sequence of operations required to start a self-refreshing operation when the backup power source starts to supply electric power to the new memory module. As a result, a newly installed memory module consumes as great electric power in the backup-mode operation as in a normal-mode operation.

In the normal operation mode, the dynamic RAM needs power consumption a few thousand times greater than the power consumption required when the operation is performed in the self-refreshing mode. Therefore, the storage device having expanded memory modules runs out of battery energy in a very short time. Even if the RAS and CAS signals, produced by the controlling circuits of the newly installed memory module are lowered in turn to the L-level so as to start a self-refreshing operation, the new memory module consumes rather great electric power during a time period from the installation of the memory module to the start of the self-refreshing operation.

SUMMARY OF THE INVENTION

It is an object of the present invention to provide a storage device using a dynamic RAM that has a minimized circuit in a memory controller to which the backup power should be supplied, that does not consume a great amount of electric power when an additional memory module is installed for memory expansion, and that needs minimized power consumption for the self-refreshing operation thereby achieving a longer backup time with a smaller battery capacity.

The storage device according to the present invention comprises: a power supply controller that operates as a common component; and one or more memory modules that are commonly controlled by the power supply controller. When the power supply controller receives a power-on instruction from the outside, it converts commercial AC power to DC power and supplies it to a power line of the storage device. On the other hand, when the power supply controller receives a power-off instruction, it starts to supply DC power to a backup power line from a backup power source such as a battery, and then shuts off the main power source to the power line. The power supply controller then outputs a backup instruction signal. The memory module includes a dynamic RAM for storing information which is held via refreshing operations performed periodically in predetermined time intervals.

The dynamic RAM is of the type that includes a self-refreshing circuit. When the memory controller receives an access instruction signal issued by an upper level device, the memory controller outputs a control signal to the dynamic RAM so as to instruct the dynamic RAM to perform a read, write, or refresh operation. More specifically, RAS and CAS signals are lowered in turn to an L-level with predetermined timing for a predetermined time period so that the dynamic RAM performs a read, write, or refresh operation. On the other hand, when the memory controller receives a backup instruction signal from the power supply controller, the memory controller transmits a control signal to instruct the dynamic RAM to perform a self-refreshing operation. More specifically, in response to high-to-low transitions of the CAS and RAS signals that occur in turn with predetermined timing, the dynamic RAM performs a self-refreshing operation.

The driver circuit is enabled when the memory controller is released from a reset state, and disabled when the memory controller goes to a set state. When the driver circuit is in an enable state, the driver circuit converts the control signals (CAS, RAS) output by the memory controller to driving signals for driving the dynamic RAM and outputs the resultant signals to the memory unit. The backup power supply controller receives a power line and a backup power line extending from the power supply controller. When electric power is supplied via the power line from the main power source, the backup power supply controller transfers the electric power received from the main power source via the power line to the memory circuit. On the other hand, if the power supply is switched from the power line to the backup power line, the backup power controller transfers the electric power received via the backup power line to the dynamic RAM.

Furthermore, when the dynamic RAM receives electric power via the backup power line for the first time as in the case after installation of an additional memory module, the backup power controller inhibits the supplying of power to the newly installed memory module of the dynamic RAM so that no power consumption occurs in the newly installed memory module. The memory controller transmits a control signal to the driver circuit so as to start a self-refreshing operation of the dynamic RAM, and then further transmits a disable control signal to the diver circuit so as to prohibit the driver circuit from outputting a control signal. The signal lines from the driver circuit to the dynamic RAM are connected to ground via pull-down resistors so that these signal lines are fixed to an L-level when the storage device is in a data backup state thereby ensuring a reliable self-refreshing operation. Furthermore, there is provided a power voltage monitor for monitoring the voltage of the power line extending from the power supply controller. If the power voltage monitor detects that the voltage of the power line drops to a level lower than a predetermined value after the power supply is shut off, then the power supply voltage monitor transmits a reset signal to the memory controller.

The driver circuit includes a NAND gate of the open collector type wherein a driver control signal output by the memory controller is applied to one input of the NAND gate and the reset signal generated by the power supply voltage monitor is applied to the other input. If the driver control signal applied to the NAND gate is in an enable state or the reset signal is released from a reset state, the driver circuit is enabled. On the other hand, if the driver control signal is in a disable state, or the reset signal is in a set state, the driver circuit is disabled.

If the memory controller receives a backup instruction signal from the power supply controller when handling of a read/write instruction issued by a higher level device is in progress, the memory controller starts a self-refreshing operation of the dynamic RAM according to the backup instruction after completing the read/write operation of the dynamic RAM according to the read/write instruction. This processing rule prevents an erroneous operation that would otherwise occur when a collision occurs between a self-refreshing operation of the dynamic RAM according to the backup instruction and a read/write operation of the dynamic RAM according to the read/write instruction.

When the power supply is switched from the backup power to the main power source, the power supply controller shuts off the backup power after transmitting a backup instruction signal E3 to the memory controller. Upon starting of the operation under the electric power supplied by the main power source, the memory controller receives a backup instruction and continues the self-refreshing operation of the dynamic RAM. Then the backup signal is disabled. In this situation, if a valid refresh instruction signal is received from the upper level device, the self-refreshing operation of the dynamic RAM is stopped. This procedure prevents data from being lost even if the refresh instruction is invalid which is issued by the upper level device after the electric power has been switched to the main power source.

The backup power supply controller includes: a diode via which electric power received via the power line is directly output to the memory unit; a first switching circuit which is turned on in response to the power supply voltage input by the above diode; and a second switching circuit which outputs electric power received via the backup power line to the memory unit provided that when electric power is supplied via the backup power line, the first switching circuit is in an on state. The backup power supply controller also includes a backup selection circuit for selecting a power backup mode in which electric power is supplied to the memory unit from the backup power source when electric power from the power line is shut off. The backup selection circuit includes: a selection switching circuit for selecting whether electric power is supplied to the dynamic RAM from the backup power source; and a prohibition circuit by which the first switching circuit is enabled when the selection switching circuit is at its first switching position whereas the first switching circuit is disabled when the above selection switching circuit is at its second switching position. The selection switching circuit also includes a switch mounted on a circuit board wherein the switch has on and off positions. The selection switching circuit may be constructed using a relay unit of the latch type which is turned on or off in response to the instruction signal issued by the upper level device.

In the storage device according to the present invention, the memory controller, dynamic RAM, driver circuit, and backup power source are all mounted on the same circuit board in such a manner as to form a memory module that can be removably attached to the main body of the storage device, wherein a single power supply controller is installed in the storage device so that it is used as a common module. This arrangement allows a desirable number of additional memory modules to be installed in the main body of the storage device as long as the number of the memory modules does not exceed a predetermined maximum limit. In this technique, a memory unit is formed with one or more memory modules and one common module. This memory unit may be installed in various devices such as: a semiconductor memory device used as an external storage device of a computer system; a main memory unit of a computer system; a buffer memory of a file management device which manages various devices such as a magnetic disk device, a magnetic tape storage device, or an optical disk device; or a buffer memory of a magnetic disk controller which controls the operation of a magnetic disk device.

In the storage device constructed in the manner described above according to the present invention, when the main power source is shut off, backup power is supplied only to the dynamic RAM and its input circuit, and thus power consumption is reduced to a level much lower than in the case where backup power is supplied to the entire memory circuit including the memory controller and the driver circuit as is the case in the conventional technique. Furthermore, the RAS and CAS signal lines are both grounded via pull-down resistors so that these signal lines are firmly held at an L-level when electrical power supply is switched to the backup power source thereby ensuring a reliable self-refreshing operation. After completion of a sequential control process for lowering the CAS and RAS signals in turn to an L-level with predetermined timing in response to an backup instruction signal thereby starting a self-refreshing operation, if a reduction in the power supply voltage is detected, the memory controller is forced to be reset thereby disabling the driver circuit.

This ensures that the CAS and RAS signals are firmly fixed to the L-level and will remain in the L-level when the power supply is shut off later. At the time immediately after an additional memory module for expansion has been installed, electrical power is supplied first from the backup power source to the newly installed memory module. However, in such a case where the electric power is supplied first from the backup power source, the electric power from the backup power source is not actually applied to the dynamic RAM included in the newly installed memory module since power supply to the dynamic RAM of the newly installed memory module is disabled by the backup power controller so as to avoid unnecessary power consumption of the battery. As a result, the power consumption required for a backup operation is minimized, and the maximum possible backup time becomes much greater than that in the conventional technique. Thus, performance of the storage device is greatly improved.

The above and other objects, features, and advantages of the present invention will become more apparent from the following detailed description with reference to the drawings.

BRIEF DESCRIPTION OF THE DRAWINGS

FIGS. 5A and 5B are timing charts of control signals relating to a read operation of the dynamic RAM shown in FIG. 4;

FIGS. 6A–6C are timing charts of control signals relating to a write operation of the dynamic RAM shown in FIG. 4;

FIGS. 7A–7C are timing charts of control signals relating to a refresh operation of the dynamic RAM shown in FIG. 4;

DESCRIPTION OF THE PREFERRED EMBODIMENTS OPERATION ENVIRONMENT AND ENCLOSURE STRUCTURE

Figure 1:
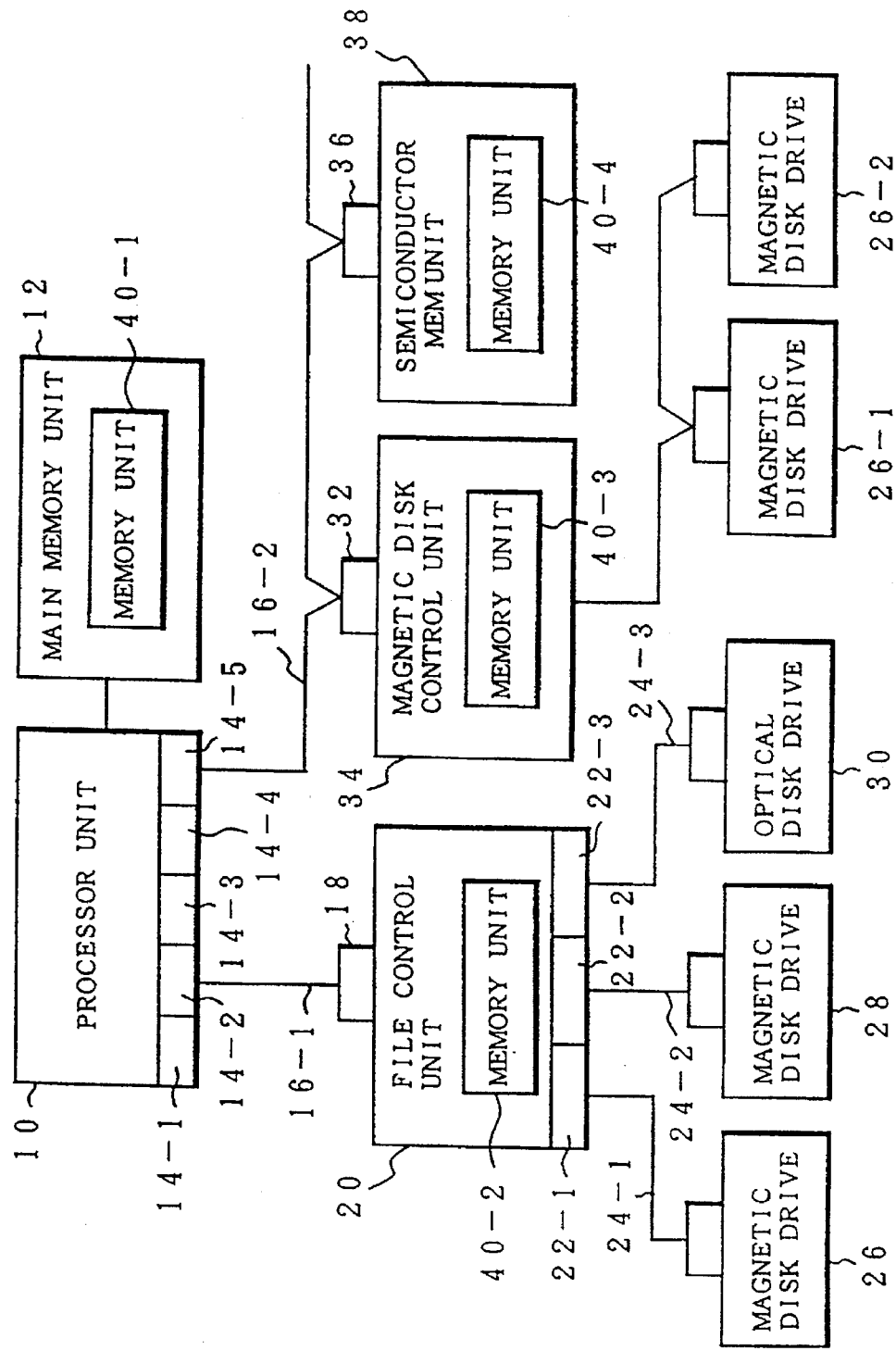
FIG. 1 is a block diagram illustrating an operation environment relating to the present invention.

FIG. 1 illustrates an example of an operation environment for a storage device according to the present invention. In FIG. 1, a processor unit 10 acts as an upper level device that operates in conjunction with a main memory unit 12. The processor unit 10 has, for example, five channel units 14-1 through 14-5. A channel bus 16-1 is connected, for example, to the channel unit 14-2 wherein the other end of the channel bus 16-1 is connected to a port 18 of a file control unit 20.

The channel unit 14-5 is connected to a channel bus 16-2 wherein the other end of the channel bus 16-2 is connected to a port 32 of a magnetic disk control unit 34 as well as a port 36 of a semiconductor memory unit 38. The file control unit 20 has for example three device ports 22-1 through 22-3 connected to device buses 24-1 through 24-3, respectively, wherein the other ends of these device buses are connected to a magnetic disk drive 26, a magnetic disk drive 28, and an optical disk drive 30, respectively. The magnetic disk control unit 34 is connected to for example two magnetic disk drives 26-1 and 26-2. In the operation environment described above, a memory unit 40-1 forming a storage device according to the present invention is provided in the main memory unit 12. Another memory unit 40-2 forming a storage device according to the present invention is installed as a buffer memory in the file control unit 20. Furthermore, a memory unit 40-3 forming a storage device according to the present invention is installed as a buffer memory in the magnetic disk control unit 34. A memory unit 40-4 forming a storage device according to the present invention is installed as a memory unit in the semiconductor memory unit 38. The memory units 40-1 through 40-4 are constructed using dynamic RAMs as memory devices. Unlike the magnetic disk drives 26, 26-1, and 26-2, the semiconductor memory unit 38 is a static device including no movable elements. The semiconductor memory unit includes a dynamic memory unit 40-4 provided with a dynamic RAM and has a storage capacity in the range from 128 MB to 512 MB.

Figure 2:
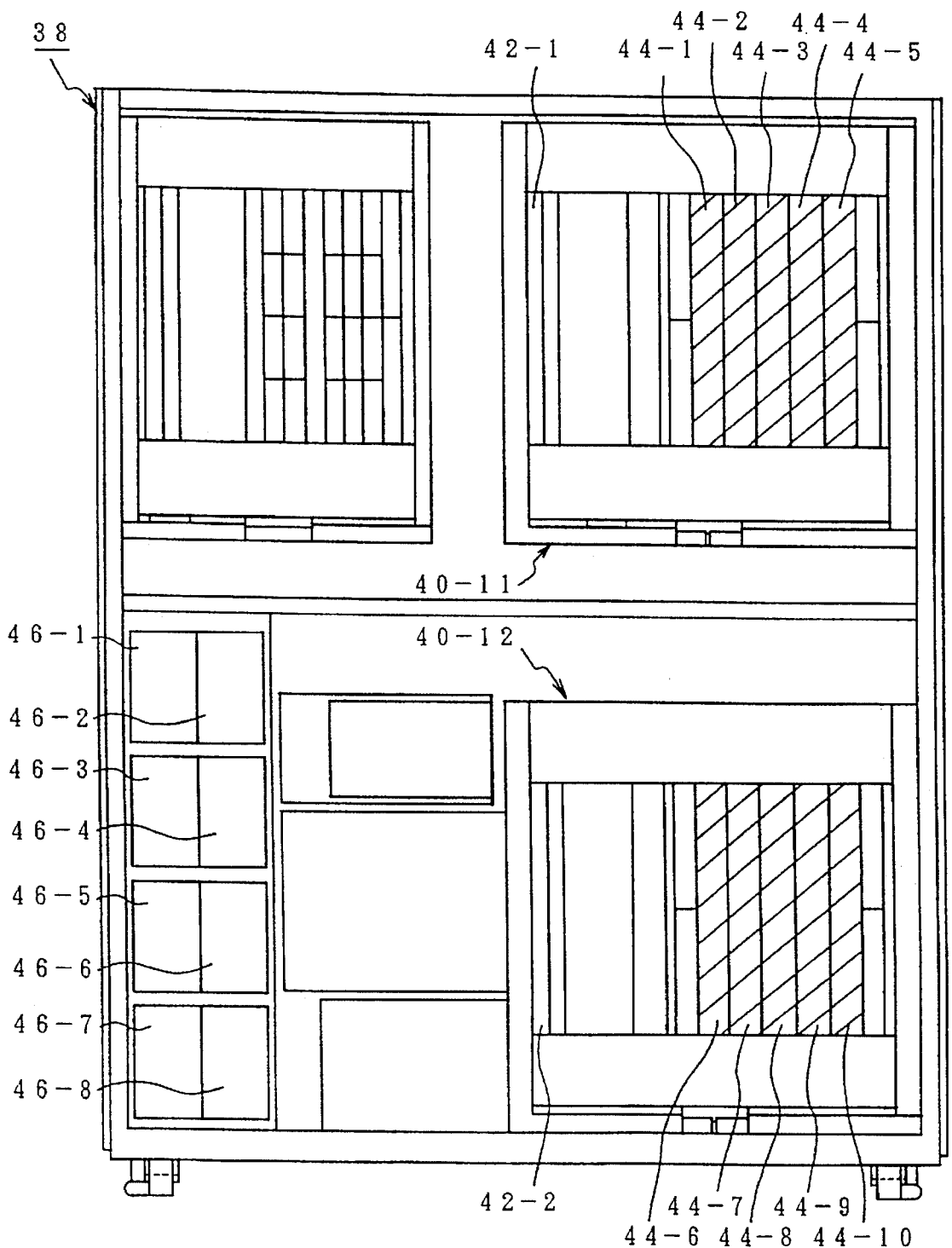
FIG. 2 is a schematic diagram of the enclosure of the semiconductor memory unit shown in FIG. 1.

FIG. 2 illustrates the structure of the enclosure of the semiconductor memory unit 38 shown in FIG. 1. In this enclosure, two memory units 40-11 and 40-12 are disposed at upper and lower locations, respectively. In the case of the memory unit 40-11, the memory unit includes a power supply control module 42-1 serving as a common part. The memory unit 40-11 also includes five memory modules 44-1 through 44-5 which are all connected to the power supply control module 42-1. Similarly, a memory unit 40-12 at the lower location includes five memory modules 44-6 through 44-10 connected to a common power supply module 44-2. In the present invention, as described above, one memory unit is constructed with a combination of a power supply control module 42-1 or 42-2 and memory modules 44-1 through 44-5 or 44-6 through 44-10. Each memory unit 40-11, 40-12 may include an arbitrary number of memory modules in the range from a minimum of one to a maximum of five. Therefore, memory modules may be expanded as required within the above range. When an additional memory module for expansion is installed, the main power source of the memory unit is turned off while supplying electric power from a battery so as to preserve the data. At a lower left location of the semiconductor memory unit 38, there is provided a batteries 46-1 through 46-8 serving as a backup power source. When the main power source connected to a commercial AC line is shut off, electric power is supplied to the memory unit from the backup power source including the batteries 46-1 through 46-8.

CIRCUIT CONFIGURATION OF THE MEMORY UNIT

Figure 3:
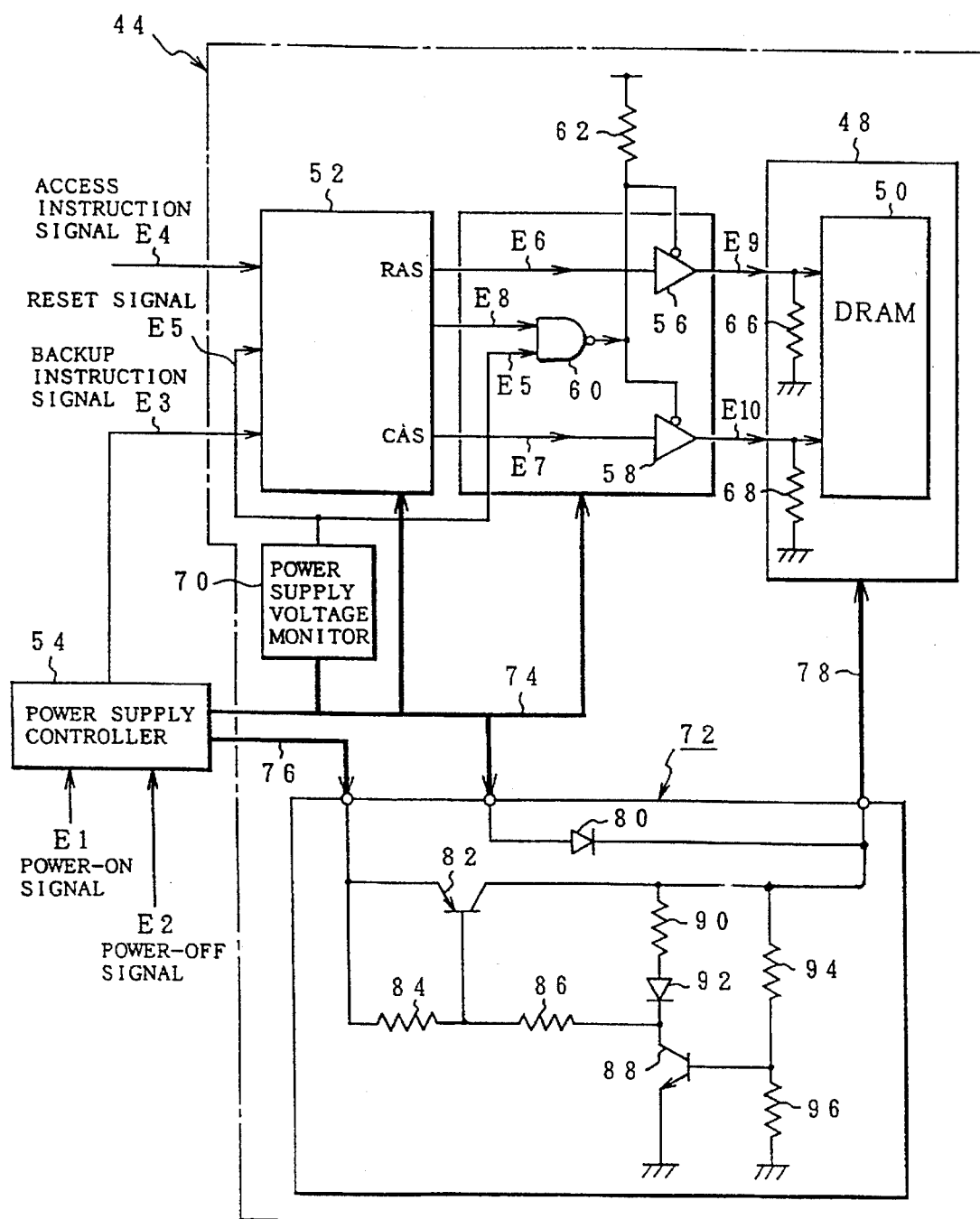
FIG. 3 is a circuit diagram of an embodiment according to the present invention.

FIG. 3 illustrates an embodiment of a storage device according to the present invention. A memory unit 40 forming a storage device according to the present invention includes one or more expandable memory modules 44 and a power supply controller 54 which is a common part for all memory modules 44. A memory module 44 includes a memory circuit 48 which includes a dynamic RAM 50. The dynamic RAM 50 used here is of the type which includes a built-in self-refreshing circuit. A specific example of this type dynamic RAM is 16-Mbit dynamic RAM μPD42S16400L available from NEC.

Figure 4:
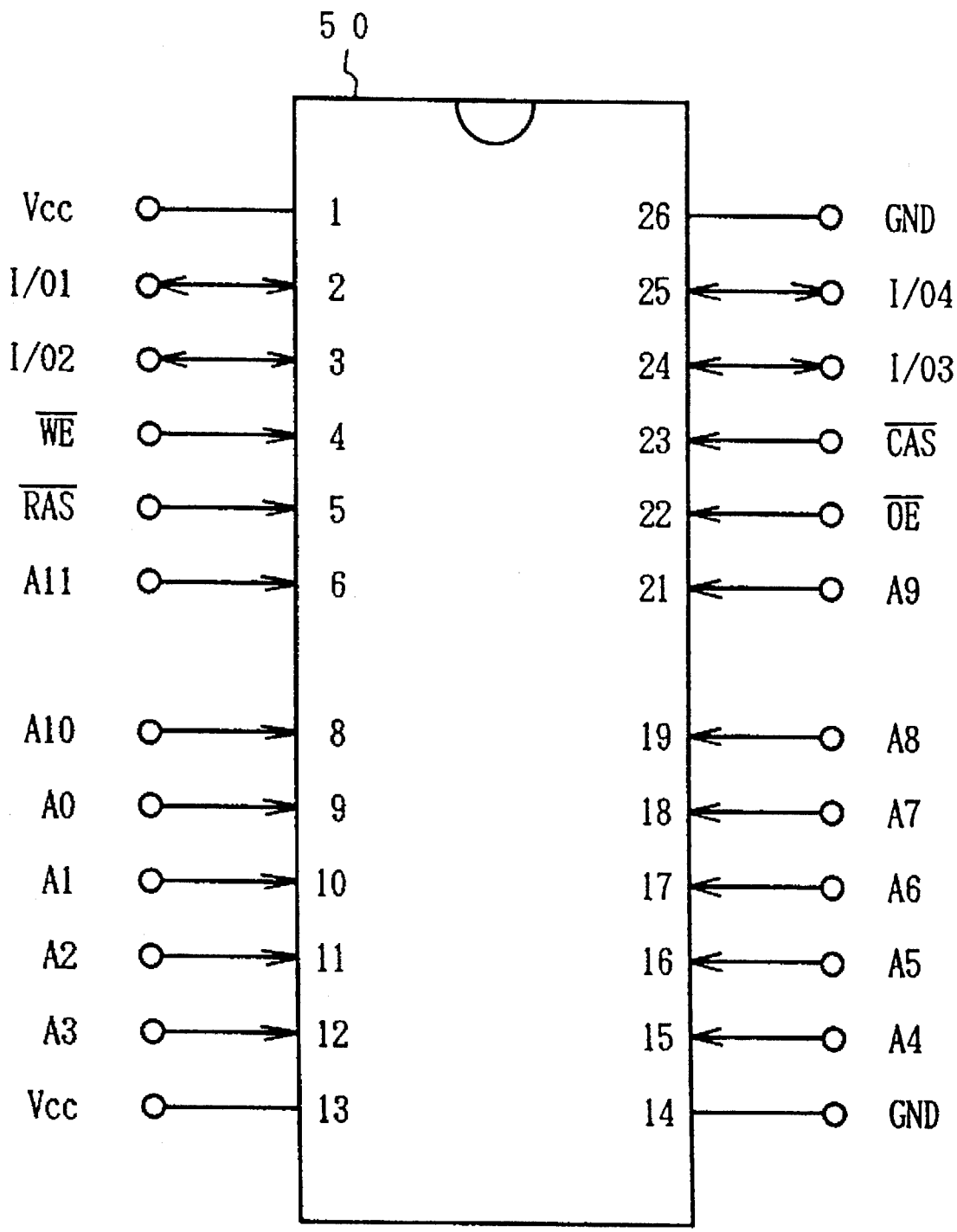
FIG. 4 is a schematic diagram of a package of a dynamic RAM used in the present invention.

FIG. 4 illustrates the package of the dynamic RAM 50. This package of the dynamic RAM has 26 pins. In FIG. 4, AO-A11 denote address input pins, I/0-1-I/04 data input/output pins, RAS a raw address strobe pin, CAS a column address strobe pin, WE a write enable pin, OE an output enable pin, Vcc a power supply pin, and GND a ground pin. In the memory circuit 48 shown in FIG. 3, there are shown only control lines relating to RAS and CAS which are essential to the refreshing and self-refreshing operations of the dynamic RAM 50 shown in FIG. 4.

FIGS. 5A, 5B, 6A through 6C, and 7A through 7C are timing charts of the RAS signal E6 and the CAS signal E7 which are output by the memory controller 52 shown in FIG. 3 so as to control the refreshing operation of the dynamic RAM 50. FIGS. 5A and 5B are timing charts relating to read and write operations which are performed, under a normal power supply condition, in response to an access instruction signal issued by the upper level device. First, the access instruction signal received from the upper level device is interpreted, and the RAS signal E6 is lowered from an H-level to an L-level at a predetermined time as shown in FIG. 5A. After a predetermined delay period, as shown in FIG. 5B the CAS signal E7 falls down from an H-level to an L-level. In response to these transitions, the dynamic RAM 50 performs a read or write operation.

FIGS. 6A through 6C are timing charts of the RAS and CAS signals E6 and E7 which are generated to start a self-refreshing operation when the main power source is shut off and electric power is supplied by the battery serving as a backup power source. If the power supply is switched from the main power source to the backup power source for example at time t1, then the backup instruction signal E3 rises from an L-level to an H-level as shown in FIG. 6A. After a predetermined time delay from the above transition of the backup instruction signal E3, the CAS signal E7 falls down from an H-level to an L-level as shown in FIG. 6C. After another predetermined delay period has elapsed, the RAS signal E6 falls down from an H-level to an L-level as shown in FIG. 6B. In response to the CAS-before-RAS transition described above, the self-refreshing circuit provided in the dynamic RAM 50 starts its operation, and the self-refreshing operation is performed periodically with a consumption current as low as a few hundred μA as long as both RAS and CAS signals E6 and E7 are maintained at the L-level.

FIGS. 7A through 7C are timing charts of the backup instruction signal E3, the RAS signal E6, and CAS signal E7 which may occur when a read/write instruction and a self-refreshing instruction are issued in an overlapping fashion. That is, if an emergency power off instruction is issued at time t1, in response, for example, to a failure during a normal operation using the main power source of the device, the backup instruction signal E3 rises up to an H-level as shown in FIG. 7A thereby instructing that the RAS signal E6 and the CAS signal E7 should be generated in the same manner as in FIG. 6B and 6C, respectively so as to start a self-refreshing operation. However, at the same time, a read/write instruction is also issued by the upper level device, which indicates that the RAS signal E6 should change at time t2 as the same manner as in FIG. 5A, and then the CAS signal E7 should change in the same manner as in FIG. 5B. In this case, an actual transition of the RAS signal E6 is as shown in FIG. 7B and an actual transition of the CAS signal E7 is as shown in FIG. 7C. As can be seen from these figures, in case where overlapping occurs between a read/write instruction of FIGS. 5A and 5B and a self-refreshing instruction in response to the starting of a backup power mode as in FIGS. 6A–6C, the RAS signal E6 and the CAS signal E7 will be the result of a logical OR operation between the outputs corresponding to these instructions as shown in FIGS. 7B and 7C. That is, the RAS signal E6 falls down from an H-level to an L-level at time t2 as shown in FIG. 7B in response to the transition of the RAS signal E6 according to a refreshing instruction as shown in FIG. 5A. After a short time delay, the CAS signal E7 changes from an H-level to an L-level as shown in FIG. 7C in response to the transition of the CAS signal E7 according to a power backup instruction as shown in FIG. 6C.

In the case of FIGS. 7B and 7C, because the transitions of the RAS signal E6 and the CAS signal E7 occur in the order opposite to that in the case of the self-refreshing operation shown in FIGS. 6B and 6C, the dynamic RAM 50 cannot start a self-refreshing operation and thus there is a possibility that data will be lost during an operation in a backup power mode. In the present invention, as will be described in detail below, the problem described in FIGS. 7A–7C can be avoided and the dynamic RAM 50 can start a self-refreshing operation in response to a backup instruction signal E3.

Referring again to FIG. 3, the memory circuit 48 including the dynamic RAM 50 is connected to the memory controller 52 via the driver circuit 64. An access instruction signal E4 output by the upper level device is applied to the memory controller 52. The access instruction signal E4 is interpreted so as to determine which one of a plurality of operations including read, write, and refreshing operations is designated by the access instruction signal E4. In the case where the memory controller 52 detects that the access instruction signal E4 designates a read/write operation, the memory controller 52 outputs RAS and CAS signals E6 and E7 to the driver circuit 64 at the times shown in FIGS. 5A and 5B, respectively. The driver circuit 64 includes drivers 56 and 58 each having an enable input. A specific example of such a driver 56 or 57 is a driver device SN74LVT16244 available from Texas Instruments.

The enable input of each driver 56, 58 is connected to a power supply voltage Vcc via a pull-up resistor 62. The enable input of each driver 56, 58 is also connected to the output of a NAND gate 60 so that a control signal output by the NAND gate 60 is applied to the drivers 56 and 58. A driver control signal E8 output by the memory controller 52 is applied to the NAND gate 60.

When the memory controller 52 is released from a reset state, the driver control signal E8 is at an H-level. In this state, the other input of the NAND gate 60 is also at an H-level because the reset signal E5 is at an H-level. As a result, the NAND gate 60 provides an L-level output which enables the drivers 56 and 58. Thus, the drivers 56 and 58 transfer the RAS and CAS signals E6 and E7 generated by the memory controller 52 to the dynamic RAM 50 as the driver signals E9 and E10. On the other hand, if the memory controller 52 goes to a reset state, the driver control signal E8 falls down to an L-level, and thus the output of the NAND gate 60 goes to an H-level. As a result, the drivers 56 and 58 are disabled (their outputs are held in a high-impedance state). In this state, neither the RAS signal E6 nor the CAS signal E7 generated by the memory controller 52 can pass through the drivers 56 and 58 and thus neither the driver signal E9 nor E10 is output to the dynamic RAM 50.

The power supply controller 54, which is commonly used by all memory modules 44, turns on the main power source in response to a power-on instruction signal E1 issued by the upper level device. If a power-off instruction signal E2 is applied to the power supply controller 54, it starts to supply electric power from the backup power source, and then turns off the main power source. The power supply controller 54 is connected to the memory module 44 via the power line 74. In response to the power-on instruction signal E1, the main power source provides DC power, which is obtained by rectifying AC power supplied via a commercial AC line, over the power line 74 which is connected directly to the memory controller 52 and the driver circuit 64 in the memory module 44. On the other hand, electric power is supplied to the memory circuit 48 including the dynamic RAM 50 via the diode 80 in the backup power supply controller 72 and further via the memory power line 78. The power supply controller 54 is also connected to the memory module 44 via the backup power line 76.

If it is commanded via the power-off instruction signal E2 that the main power supply should be shut off, the power supply controller 54 starts to supply backup power to the backup power line 76 while maintaining the power supply from the main power source to the power line 74. Then the backup power supply controller 72 starts to supply electric power obtained via the backup power line 76 to the memory power line 78 provided that electric power was supplied from the main power source before starting to supply electric power from the backup power source. If a predetermined time period has elapsed since the backup power source started to supply electric power to the backup power line 76, the power supply controller 54 shuts off the power supply from the main power source to the power line 74. Furthermore, in response to the power-off instruction signal E2, the power supply controller 54 supplies backup power from the battery to the backup power line 76 and, at the same time, outputs a backup instruction signal E3 to the memory controller 52. If the memory controller 52 receives the backup instruction signal E3, as shown in the timing charts of FIGS. 6A–6C, the memory controller 52 changes the CAS and RAS signals E7 and E6 connected to the driver circuit 64 to an L-level in turn with predetermined timing thereby applying driver signals E9 and E10 at an L-level to the dynamic RAM 50 via the drivers 56 and 58 so as to force the dynamic RAM 50 to start a self-refreshing operation. After the dynamic RAM 50 has started the self-refreshing operation, the driver signals E9 and E10 should be maintained firmly at the L-level. The memory controller 52 continues a normal operation until the power supply from the main power source to the power line 74 is shut off by the power supply controller 54. This ensures that the dynamic RAM 50 correctly performs a self-refreshing operation in response to the high-to-low transitions of the RAS and CAS signals E6 and E7.

Subsequently, the electric power is switched to the backup power, and the power supply controller 54 stops supplying electric power from the main power source to the power line 74. In this state in which the electric power to the power line 74 is shut off, the supply voltage of the memory controller 52 and the driver circuit 64 falls down and therefore these circuits become unstable. Therefore, it is required that the driver signals E9 and E10 should be maintained firmly at the L-level. For this purpose, there is provided a power supply voltage monitor 70 connected to the power line 74. If the power supply voltage monitor 70 detects that the voltage of the power line 74 becomes lower than a predetermined threshold voltage, the power supply voltage monitor 70 outputs a reset signal E5. A specific example of the power supply voltage monitor 70 is a power supply voltage monitor IC AF771 available from Fujitsu.

If the electric power from the main power source to the power line 70 is shut off and the reset signal E5 is output by the power supply voltage monitor 70, the memory controller 52 goes to a reset state and the driver control signal E8 goes to an L-level. At the same time, the reset signal E5 connected to the other input of the NAND gate 60 also goes to an L-level, and therefore, the output of the NAND gate 60 goes to an H-level. Because the NAND gate 60 is of the open collector type, the NAND gate 60 is in an open collector state when the output of the NAND gate 60 is at the H-level. In this state, its output is electrically isolated from its inputs, and thus the output of the NAND gate 60 is pulled up to an H-level via the resistor 62. As a result, the drivers 56 and 58 are disabled. If the drivers 56 and 58 are disabled, the output lines of these drivers 56 and 58 connected to the dynamic RAM 50 are fixed to an L-level via pull-down resistors 66 and 68 thereby ensuring that the dynamic RAM 50 correctly operates a self-refreshing operation.

When the power supply controller 54 supplies the main electric power to the power line 74, the backup power supply controller 72 transfers the electric power received via the power line 74 to the memory power line 78 via the diode 80. If the power supply controller 54 starts to supply backup power from the battery to the backup power line 76 in response to the power-off instruction signal E2 while maintaining the power supply from the main power source to the power line 74, the backup power supply controller 72 controls the switching circuit including transistors 82 and 88 so that the backup power is supplied to the memory power line 78 via the transistor 82 while continuing the power supply to the memory power line 78 from the main power source. In this situation in which electric power is supplied to the memory power line 78 from both the main power source and the backup power source, if the power supply to the power line 74 is shut off, electric power is now supplied to the memory power line 78 only from the backup power which is supplied from the backup power line 76 via the transistors 82 and 88 which remain in the on-state.

The backup power supply controller 72 will be described in further detail below. The transistor 88, resistors 90, 94, and 96, and the diode 92 form a first switching circuit. When electric power is supplied to the power line 74 from the main power source, the transistor 88 of the first switching circuit is turned on by a bias voltage supplied to the transistor 88 via the resistors 94 and 96. As a result, a current flows through a path including the resistor 90, the diode 92, and the transistor 88. Furthermore, the transistor 82 and resistors 84 and 86 form a second switching circuit. When the transistor 88 of the first switching circuit is in the on state, a current flows from the backup power line 76 into a path including the resistors 84 and 86 thereby producing a base-bias voltage by means of voltage division via the resistors 84 and 86 and thus turning on the transistor 82 in the second switching circuit. As a result, electric power is supplied from the backup power line 76 to the memory power line 78 via the transistor 82. When both transistors 88 and 82 are in the on state, if electric power from the main power source to the power line 74 is shut off, the transistors 82 and 88 can maintain their on state because electric power is still supplied to these transistors via the backup power line 76. However, if electric power is supplied only to the backup power line 76 while supplying no electric power to the power line 74, the transistors 88 and 82 cannot turn on, and therefore electric power cannot be supplied from the backup power line 76 to the memory line 78. That is, because no electric power is supplied to the power line 74, the transistor 88 of the first switching circuit remains in the off state. In this state, even if electric power is supplied to the backup power line 76, no current flows through the resistors 84 and 86 because the transistor 88 is in the off state, and thus no bias voltage is supplied to the transistor 82. As a result, the transistor 82 remains in the off state, and no electric power is transferred from the backup power line 76 to the memory power line 78. Such a situation in which electric power is supplied only to the backup power line 76 at the beginning of an operation can occur when an additional memory module 44 is installed for memory expansion as will be described in detail later.

POWER SHUT-OFF OPERATION

FIG. 3 is referred to further. In a normal operation state, the power supply controller 54 supplies electric power to the power line 74 so that the memory controller 52 and the driver circuit 62 in the memory module 44 are supplied with electric power directly via the power line 74. On the other hand, the memory circuit 48 is supplied with electric power via the diode 80 of the backup power supply controller 72 and further via the memory power line 78. In this state, the transistors 88 and 82 of the backup power supply controller 72 are in an on state and off state, respectively. If the power supply controller 54 receives a power-off instruction signal E2 indicating that the main power source is shut off, the power supply controller 54 outputs a backup instruction signal E3 to the memory controller 52 of the memory module 44. Upon receiving the backup instruction signal E3, the memory controller 52 lowers the CAS signal E7 and then the RAS signal E6 to an L-level as shown in FIGS. 6C and 6B so that the dynamic RAM 50 starts a self-refreshing operation. At this time, the driver control signal E8 output by the memory controller 52 is at an H-level. Furthermore, the reset signal E5 output by the power supply voltage monitor 70 is also at an H-level, that is, it is released from a reset state.

As a result, the output of the NAND gate 60 is at an L-level, which enables the drivers 56 and 58. Thus, the drivers 56 and 58 convert the RAS and CAS signals E6 and E7 to the driver signals E9 and E10, respectively, and output the resultant signals to the dynamic RAM 50 thereby forcing the dynamic RAM 50 to start the self-refreshing operation. When a predetermined time period has elapsed since the backup instruction signal E3 was output, the power supply controller 54 starts to supply electric power to the backup power line 76 from the battery. As a result, the transistor 82 of the backup power supply controller 72 is turned on, and thus the memory power line 78 receives electric power also from the backup power line 76. If a predetermined time period has elapsed since the backup power source started to supply electric power, the power supply controller 52 stops supplying electric power to the power line 74 from the main power source.

If the electric power from the main power source is shut off, the voltage of the power line 74 starts to drop. When the power supply voltage monitor 70 detects that the power supply voltage becomes lower than the predetermined threshold voltage, the power supply voltage monitor 70 outputs a reset signal E5 to the memory controller 52 and also to the NAND gate 60. Upon receiving the reset signal E5, the memory controller 52 goes to a reset state. As a result, the driver control signal E8 applied to the driver circuit 62 falls down to an L-level. At this time, the reset signal E5 is also at an L-level, and therefore the NAND gate 60 goes to an open collector state in which the output of the NAND gate 60 is at an H-level. As a result, the drivers 56 and 58 are disabled and thus the outputs of these drivers 56 and 58 go to an high-impedance state isolated from any other portions. Thus, the RAS driver signal E9 and the CAS driver signal E10 connected to the outputs of these drivers 56 and 58, respectively, are fixed to the ground level or the L-level via pull-down resistors 66 and 68 thereby ensuring that the dynamic RAM 50 performs a self-refreshing operation during a state in which electric power is supplied from the backup power source.

POWER-ON OPERATION

Now, if the power supply controller 54 receives a power-on instruction signal E1 indicating that the main power source should be turned on, the power supply controller 54 outputs a backup instruction signal E3 to the memory controller 52 of the memory module 44. At the same time, the power supply controller 54 starts to supply electric power to the power line 74 from the main power source.

Until the voltage of the power line 74 reaches a predetermined value, the power supply voltage monitor 70 maintains the reset signal E5 at the L-level, so that the memory controller 52 and the driver circuit 64, which are now supplied with electric power via the power line 74, are both still maintained in the reset state as in the case where the main power source is shut off, whereby the RAS driver signal E9 and the CAS driver signal E10 applied to the dynamic RAM 50 are maintained further at the L-level thereby ensuring that the dynamic RAM 50 can continue the self-refreshing operation in a stable manner.

When a predetermined time period has elapsed after starting to supply electric power to the power line 74 from the main power source and thus the power supply voltage has risen up to a value high enough to well drive the memory controller 52, the driver circuit 64, and the memory circuit 49, the power supply controller 54 stops supplying electric power from the battery to the backup power line 76. Thus, the power supply is switched from the backup power line 76 to the main power source via the power line 74. At the same time, the power supply controller 54 also stops outputting the backup instruction signal E3 to the memory controller 52. When the backup instruction signal E3 is stopped, the reset signal E5 output by the power supply voltage monitor 70 is released and thus goes to an H-level.

At this time, the memory controller 52 changes the driver control signal E8 applied to the driver circuit 64 from low to high, thereby forcing the output of the NAND gate 60 to fall down to an L-level. As a result, the drivers 56 and 58 are enabled so that the RAS driver signal, E9 and the CAS driver signal E10 are transferred via these drivers to the RAM 50. After that, when the memory controller 52 detects a refresh instruction signal from an access instruction signal E4 issued by the upper level device, the dynamic RAM 50 stops the self-refreshing operation as follows. That is, the memory controller 52 raises the driver control signal E8 to an H-level and then returns the RAS signal E6 and the CAS signal E7 to the H-level with predetermined timing so that the dynamic RAM 50 stops the self-refreshing operation.

EMERGENCY POWER-OFF OPERATION

In the case where the main power source is shut off in usual situations, all processes required to stop the system including the memory module 44 are completed before shutting of the main power source. However, if the main power source is forced to be shut off in the middle of an operation of the memory unit owing for example to a power failure or a failure of another device connected to the upper level device, the power supply is switched to the battery serving as the backup power source. In case, when an operation of the memory module 44 is in progress, the power supply controller 54 receives a power-off instruction signal E2 indicating that the main power source should be shut off owing to an emergency, there is a possibility that the memory controller 52 receives a backup instruction signal E3 from the power supply controller 54 when the memory controller 52 is still handling a read or write operation in response to an access instruction signal E4 issued by the upper level device. In this case, a collision occurs between the read/write operation in response to the access of the upper level device and the self-refreshing operation in response to the backup instruction signal, as shown in FIGS. 7A-7C. As a result, the dynamic RAM 50 cannot start a self-refreshing operation, and thus data will be lost. To avoid the impossibility of starting the self-refreshing operation due to the invalid timing shown in FIGS. 7A-7C, the memory controller 52 shown in FIG. 3 is constructed in the manner as shown in FIG. 8.

Figure 8:
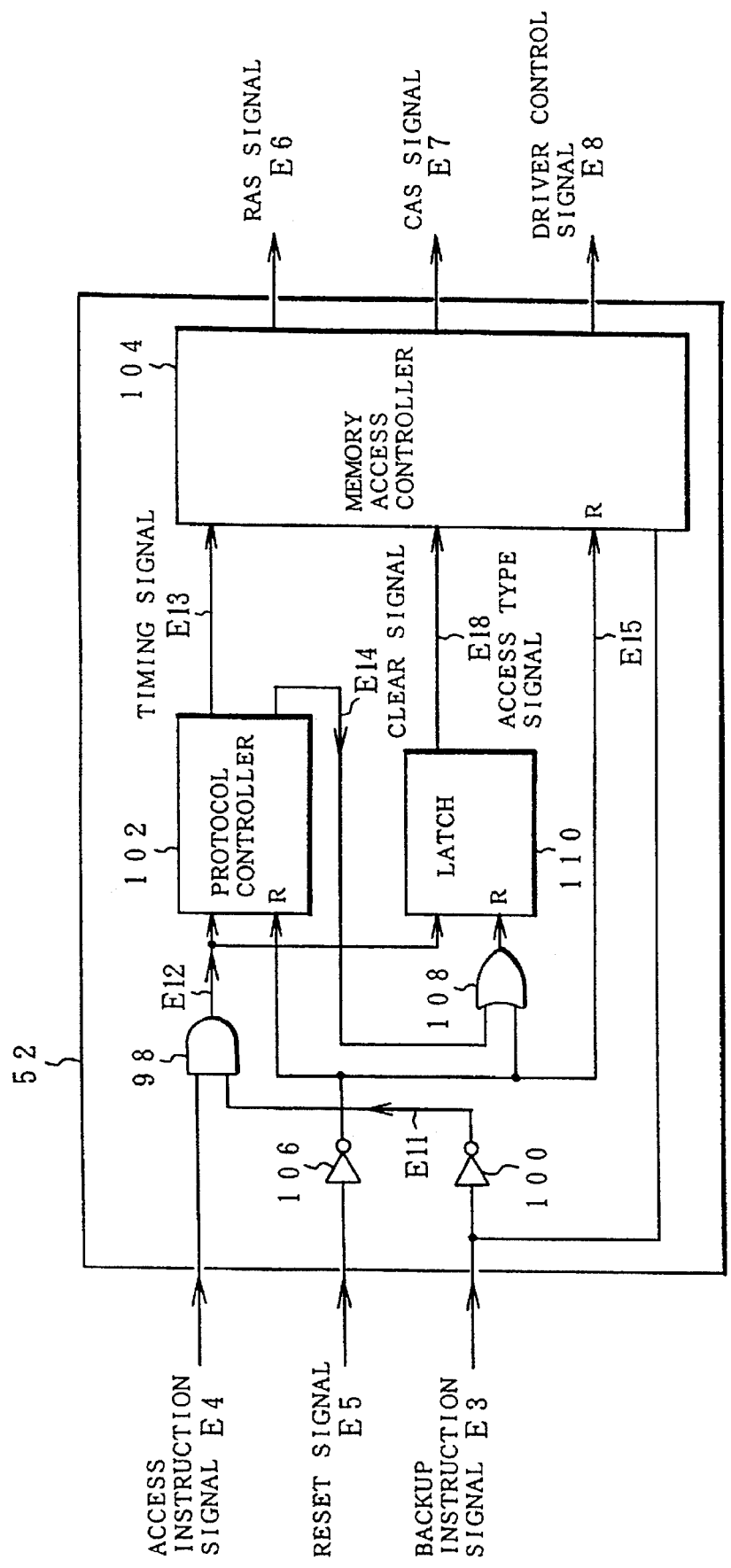
FIG. 8 is a block diagram of the memory controller circuit shown in FIG. 3.

As shown in FIG. 8, the memory controller 52 includes an AND gate 98, inverters 100 and 106, a protocol controller 102, a memory access controller 104, an OR gate 108, and a latch 110. When electric power is supplied from the main power source in a normal manner, the reset signal E5 is at an H-level and the backup instruction signal E3 is at an L-level. The backup instruction signal E3 is inverted to an H-level by the inverter 100 and then applied to one input of the AND gate 98, thereby enabling the gate 98. As a result, when an access instruction signal E4 issued by the upper level device arrives at the AND gate 98, the access instruction signal E4 passes through the AND gate 98 and is latched by the latch 110. The latch 110 outputs an access type signal E18 indicating the content of the access instruction signal E4 to the memory access controller 104. At the same time, the AND gate 98 transfers the access instruction signal E4 to the protocol controller 102. The protocol controller 102 outputs a timing signal E13 to the memory access controller 104. Upon receiving the timing signal E13 from the protocol controller 102 and the access type signal E18 from the latch 110, the memory access controller 104 determines which of three instructions including read, write, and refresh instructions is designated by the access instruction signal. The memory access controller 104 outputs a RAS signal E6, a CAS signal E7, and a driver control signal E8, depending on the content detected in the above-described manner. After completing the sequence of processes relating to the above access instruction signal, the protocol controller 102 outputs a clear instruction signal E14 to the latch 110 via the OR gate 108 so as to clear the content of the access instruction signal E4 held by the latch 110. In this circuit configuration, if the memory access controller 104 receives a backup instruction signal E3 when the access type signal E18 from the latch 110 is still applied to the memory access controller 104, the memory access controller 104 ignores the backup instruction signal E3. If a reset signal E5 is applied to the inverter 106, the inverter 106 inverts the received reset signal E5 and transmits the resultant signal to the protocol controller 102, the latch 110, and the memory access controller 104 thereby resetting these circuits.

Figure 9:
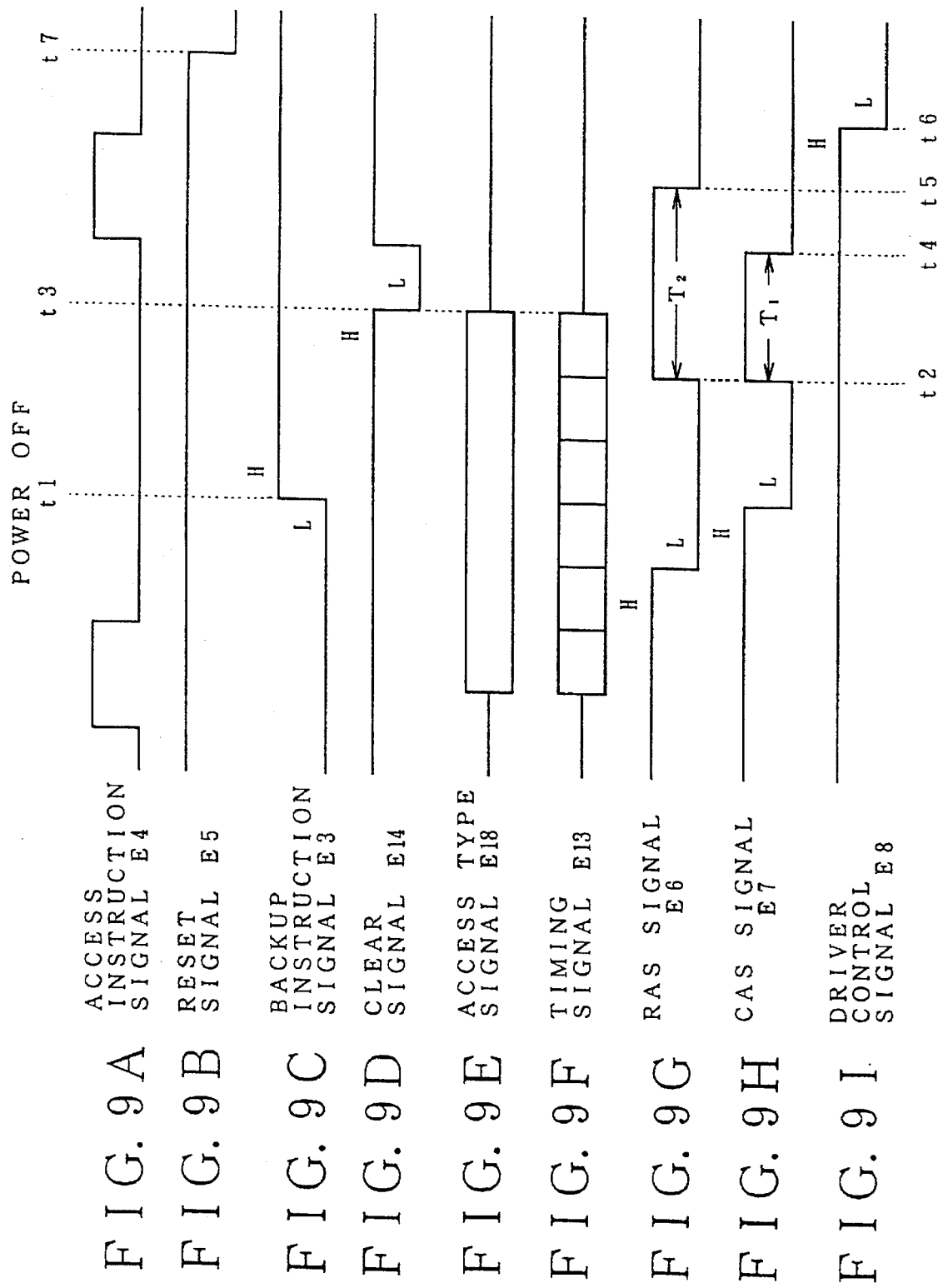
FIGS. 9A–9I are timing charts relating to a data backup operation performed by the memory controller shown in FIG. 8.

FIGS. 9A–9I are timing charts relating to the operation of the memory controller shown in FIG. 8 that occurs when the main power source is forced to be shut off when the device is operating in a normal manner. If the memory controller receives an access instruction signal E4 from the upper level device as shown in FIG. 9A, it holds the access instruction signal E4 in the latch 110. The latch 110 then outputs an access type signal E18 as shown in FIG. 9E. On the other hand, in response to the access instruction signal E4, the protocol controller 102 outputs a timing signal E13 as shown in FIG. 9F. The above-described access type signal E18 and the timing signal E13 are applied to the memory access controller 104. Upon receiving these signals, the memory access controller 104 changes the RAS signal E6 to an L-level first as shown in FIG. 9G, and then the CAS signal E7 to an L-level as shown in FIG. 9H so that a read/write operation of the dynamic RAM 50 is performed.

Now let's assume that it is commanded that the main power source should be shut off when the above processing is in progress, and thus the backup instruction signal E3 rises up to an H-level at time t1. In this case, when the backup instruction signal E3 becomes high, the memory access controller 104 is still performing the process relating to the access instruction signal E4, and thus the memory access controller 104 considers the process relating to the access instruction signal E4 to have a higher priority than the new process. Therefore, the memory access controller 104 continues further the process being in progress. If the process in progress is completed at time t3, the protocol controller 102 outputs a clear signal E14 of an L-level as shown in FIG. 9D so as to clear the content of the access instruction signal E4 held by the latch 110. As a result, the timing signal E13 and the access type signal E18 to the memory access controller 104 are ceased. At this time, the memory access controller 104 accepts the backup instruction signal E4 which has already risen to the H-level as a valid instruction signal, and starts a data backup operation.

During the access operation, the memory access controller 104 changes the CAS signal E7 to an L-level at time t4 when a predefined precharging time T1 has elapsed since time t2 at which the RAS signal E6 and the CAS signal E7 returned to the H-level, and then changes the RAS signal E6 to an L-level at time t5 when a predefined precharging time T2 has elapsed since the time t2, so that the dynamic RAM 50 starts a self-refreshing operation. Then, at time t6, the driver control signal E8 is lowered to an L-level as shown in FIG. 9I thereby disabling the drivers 56 and 58 of the driver circuit As a result, the RAS driver signal E9 and the CAS driver signal E10 applied to the dynamic RAM 50 are fixed to an L-level via the pull-down resistors 66 and 68. By this time, the backup power source has already started to supply electric power, and then the main power source has been shut off. As a result, the voltage of the power line falls down, which causes the reset signal to fall down to an L-level at time t7 as shown in FIG. 9B. Thus, the switching to the data backup state is complete.

In the example shown in FIG. 9A, an access instruction signal E4 arrives at a certain time after starting the data backup operation at time t3. However, by that time, the backup instruction signal E3 has already become high, which has been further inverted to an L-level by the inverter 100 whereby the AND gate 98 has been disabled. Therefore, in this case, the access instruction signal E4 is not applied to the protocol controller 102 and the latch 110. This means that the access instruction signal E4 is ignored.

The memory controller 52 is not limited to the example described above in conjunction with FIG. 8, and it can be constructed in any form as long as it includes: a circuit for holding an instruction given by an upper level device; a circuit for controlling the timing relating to the internal operation; and a circuit for outputting control signals relating to read, write, refresh, and self-refresh operations.

UPPER LEVEL MODULE REPLACEMENT OPERATION

In a system using a storage device according to the present invention, a module of the system which is at an upper level relative to the memory module 44 can be replaced for maintenance or for other purposes when the main power source of the storage device is turned off while backing up data. When the main power source of the storage device is turned on again after completing the replacement of the upper level module, if the upper level module does not operate in a correct manner due to some failure, the data stored in the memory unit can be lost when the operation of the memory unit returns from the data backup mode to a normal mode in which electric power is supplied from the main power source. In the present invention, the above problem is avoided in a manner described below. That is, in case where an upper level device fails to correctly start a refreshing operation of the dynamic RAM after the main power source is turned on and the memory module returns to a normal mode from a data backup mode, the self-refreshing operation is performed so as to protect the data from the failure of the upper level module thereby preventing the data from being lost. This capability is realized with the memory access controller 104 in the memory controller 52 shown in FIG. 8.

Figure 10:
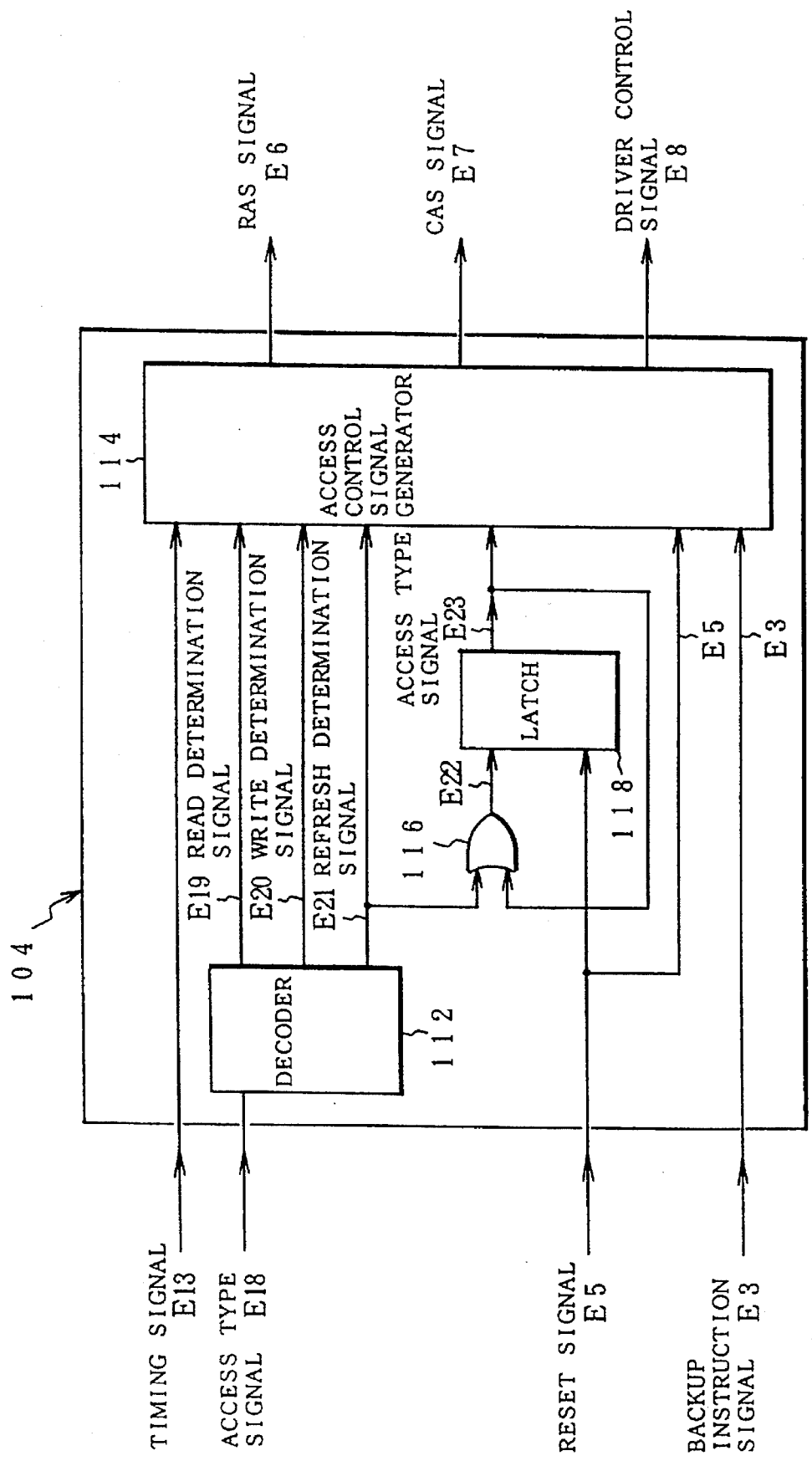
FIG. 10 is a block diagram of the memory access controller circuit shown in FIG. 8.

FIG. 10 is a block diagram illustrating the details of the memory access controller 104 shown in FIG. 8. As shown in FIG. 10, the memory access controller 104 includes a decoder 112, an access control signal generator 114, an OR gate 116, and a latch 118. The decoder 112 determines which of three instructions including read, write, and refreshing instructions is designated by the access instruction signal on the basis of the access type signal E18 indicating the content of the access instruction signal held by the latch 110 shown in FIG. 8, and then outputs one of three determination signals including read, write, and refresh determination signals E19, E20, and E21, corresponding to the above determination result. The latch 118 receives a refresh determination signal E21 from the decoder 112 via the OR gate 116 and latches the received signal. The latch 118 then outputs an access permission signal E23 to the access control signal generator 114. The access control signal generator 114 accepts the refresh determination signal E21 when the reset signal E5 is released to an H-level and the backup instruction signal E3 is released to an L-level. Subsequently, the access control signal generator 114 receives an access permission signal E23 which is generated by the latch 118 in response to the refresh determination signal E21. Upon receiving the access permission signal E23, the access control signal generator 114 returns the RAS signal E6 to the H-level and then returns the CAS signal E7 to the H-level thereby releasing the self-refreshing operation which is performed provided that the RAS and CAS signals are at the L-level. On the other hand, when the reset signal E5 is released to an H-level and the backup instruction signal E3 is also released to an L-level after switching the power supply from the backup power source to the main power source, if the upper level device has a failure which causes the decoder 112 to fail to correctly detect the refresh instruction from the access type signal E18 which indicates the content of the access instruction signal E4 issued by the upper level device and thus if the decoder 112 fails to output a refresh determination signal E21, the access control signal generator 114 fixes the driver control signal E8 at an L-level. Furthermore, the access control signal generator 114 also maintains the RAS signal E6 and the CAS signal E7 at an L-level so that, even after when power supply is returned to the main power source, the dynamic RAM 50 continues the self-refreshing operation so that the data is preserved. The above-described operation procedure ensures that the data in the dynamic RAM 50 is preserved even when the upper level device has a failure and thus cannot transmit an access instruction signal indicating a refreshing operation.

Referring to the timing charts of FIGS. 11A–11I, the operation of the memory access controller 104 shown in FIG. 10 that is performed when the main power source is turned on will be described in more detail below. When the storage device is in a data backup mode, if the main power source is turned on, the power supply voltage on the power line 74 in the memory module 44 shown in FIG. 3 rises up. If the power supply voltage monitor 70 detects that the power supply voltage exceeds the predetermined threshold, the power supply voltage monitor 70 changes the reset signal E5 shown in FIG. 11A from high to low. When a predetermined time period has elapsed since the main power source started to supply electric power to the power line 74, the power supply controller 54 stops supplying electric power to the backup power line 76. Thus, the switching from the backup power source to the main power source is complete.

Figure 11:
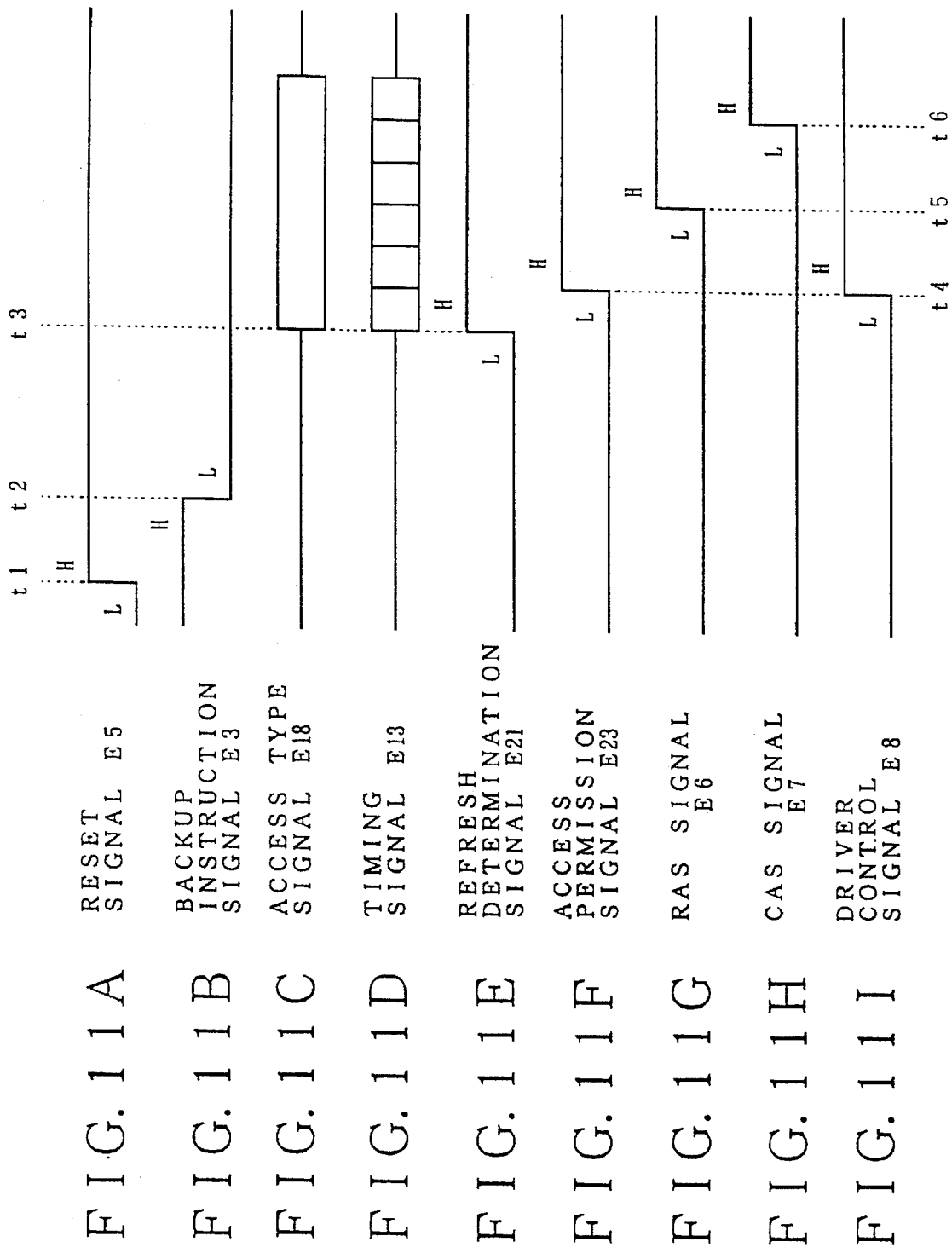
FIGS. 11A–11I are timing charts relating to an operation performed by the memory access controller shown in FIG. 10 during a data backup operation.

Meanwhile, the power supply voltage on the power line 74 becomes high enough, and the reset signal E5 rises up to an H-level at time t1 as shown in FIG. 11A whereby the reset state is released. Subsequently, the backup instruction signal E3 falls down to an L-level at time t2 as shown in FIG. 11B whereby the backup instruction is released.

Once the reset state is released in response to the low-to-high transition of the reset signal E5 and the backup instruction is released in response to the high-to-low transition of the backup instruction signal E3, the access control signal generator 114 becomes enabled. In this situation, the driver control signal E8 output by the access control signal generator 114 is at an L-level as shown in FIG. 11I thereby disabling the drivers 56 and 58 shown in FIG. 3. The RAS signal E6 and the CAS signal E7 are also at an L-level as shown in FIGS. 11G and 11H. Thus, the dynamic RAM 50 performs the self-refreshing operation repeatedly so as to preserve the data.

In this situation, however, if the self-refreshing operation of the dynamic RAM 50 is guaranteed by the RAS and CAS signals E6 and E7 being held at the L-level, then the drivers 56 and 58 are allowed to be enabled by raising the driver control signal E8 to an H-level immediately after the reset state is released in response to the transition of the reset signal E5 or immediately after the backup state is released in response to the transition of the backup signal E7. After completion of a sequence of processes for turning on the main power source, an access signal including a refreshing instruction issued by the upper level device is received at time t3 and latched by the latch 110 which in turn outputs an access type signal E18 to the decoder 112 as shown in FIG. 11C. The decoder 112 determines which one of the read, write, or refresh instructions is designated by the access instruction issued by the upper level device, and outputs the result to the access control signal generator 114. In the present invention, after turning on the main power source, the upper level device transmits first an access instruction signal indicating that a refreshing operation should be performed. The decoder 112 interprets the received access type signal E18. If the decoder 112 detects that the access type signal E18 indicates that the access instruction signal is a refreshing instruction, then the decoder 112 raises the refresh determination signal E21 to an H-level at time t3 as shown in FIG. 11E. The refresh determination signal E21 is applied to the access control signal generator 114. At the same time, the refresh determination signal E21 is also applied to the latch 118 via the OR gate 116 and latched there.

Subsequently, the access permission signal E28 output by the latch 118 is raised to an H-level at time t4 as shown in FIG. 11F, whereby the access control signal generator 114 is enabled. Because the access permission signal E23 is fed back to the input of the OR gate 116, the latch 118 holds the access permission signal E23 at the H-level until a next reset signal E5 is received. In response to the access permission signal E23, the access control signal generator 114 raises the driver control signal E8 to an H-level at time t4 as shown in FIG. 11E so that the drivers 56 and 58 shown in FIG. 3 are enabled thereby making it possible to access the dynamic RAM 50.

Subsequently, in response to the timing signal E13 shown in FIG. 11D, the access control signal generator 114 raises the RAS signal E6 to an H-level at time t5. Then at time t6, the access control signal generator 114 raises the CAS signal E7 to an H-level thereby stopping the self-refreshing operation of the dynamic RAM 50.

Once the above procedure is complete, read, write, or refresh operation can be performed on the dynamic RAM according to the access instruction given by the upper level device as long as the main power source is in an on state. On the other hand, if the upper level device fails to correctly transmit a refresh instruction which is required for the memory access controller 104 to correctly perform the operations shown in FIGS. 11C–11I at t3 and later times, the driver control signal E8, the RAS signal E6, and the CAS signal E7 are all fixed at the L-level so that the dynamic RAM 50 continues the self-refreshing operation thereby preventing the data from being lost due to the failure of the upper level device when the power supply is switched to the main power source. In the memory access controller 104 shown in FIG. 10, a refresh instruction issued by the upper level device is used as a trigger to start an access process. This is because any upper level module needs a few seconds or longer to start a memory access operation after turning on the main power source, and therefore a most likely access instruction the memory module 44 receives first is a refresh instruction. Furthermore, in case where the upper level module has a failure and cannot generate a valid access instruction for read or write operation, if the upper level module can generate a refresh instruction, it is possible to preserve the data. For this reason, the refresh instruction is employed as a trigger to start an access process.

OPERATION RELATING TO INSTALLATION OF AN ADDITIONAL MEMORY MODULE

In combination of memory modules and a common power controller 54 shown in FIG. 3 according to the present invention, the memory capacity can be expanded in units of memory modules 44 or in units of memory circuits 48 as in the semiconductor memory device shown in FIG. 2. In the case where the memory capacity is expanded in units of memory modules 44, an additional memory module 44 is installed while maintaining the storage device in a data backup state in which the main power source is turned off and electric power is supplied from the battery to the backup power line 76 so as to preserve the data.

At the time when the installation of the new memory module 44 is completed, since no electric power is supplied to the power line 74 whereas electric power is supplied to the backup power line 76, the transistor 88 of the backup power supply controller 72 is in an off state. As a result, the transistor 82 is also in an off state although electric power is supplied to the transistor 83 via the backup power line 76. Therefore, no electric power is supplied to the memory power line 78 from the backup power line 76.

This means that if a new memory module 44 is installed for expansion in a data backup state, electric power is not supplied to the newly installed memory module 44 and thus unnecessary power consumption of the battery is prevented. If the main power source is turned on after completion of the installation of the new memory module 44, electric power is supplied to the memory power line 78 from the power line 74 via the diode 80 in the backup power supply controller 72, and thus the operation mode is switched to the main power source mode in which the memory controller 52, the driver 64, and the memory circuit 48 are all supplied with electric power from the main power source.

In the above transition to the main power source mode, the electric power supplied via the power line 74 causes the transistor 88 of the backup power supply controller 72 to turn on, and thus the transistor 82 to which electric power is supplied via the backup power line 76 is also turned on. As a result, the memory power line 78 receives electric power in a parallel fashion from both the backup power line 76 and the power line 74. When a predetermined time period, for example a few msec, has elapsed since the main power source was turned on, the power supply from the battery to the backup power line 76 is turned off. As a result, the transistor 82 in the backup power supply controller 72 is turned off, and the memory power line 78 now receives electric power only from the power line 74 via the diode 80.

As a matter of course, the transistor 88 in the backup power supply controller 72 remains in the on state. Let's assume that at a certain time after that, an instruction is issued which indicates that the main power source should be turned off, and the battery starts to supply electric power to the backup power line 76. In this case, since electric power is still supplied from the power line 74 to the transistor 88 of the backup power supply controller 72, the transistor 88 is in the on state. Therefore, the electric power supplied from the backup power line 76 causes the transistor 82 to turn on and thus the memory power line 78 can receive electric power from the backup power line 76.

In the storage device of the present invention, it is possible to expand memory capacity in units of memory modules 44 shown in FIG. 3 as described above. However, it is not always required to backup all data when the main power source is shut off. In some applications, for example, it is required to preserve only an important part of the data, such as data or program stored in a particular memory unit which is used as an instruction cache memory. If the amount of data which should be preserved is small, all the data can be preserved in a small number of dynamic RAMs 50, and thus it is possible to reduce power consumption of the battery per hour during a backup operation. However, if the memory modules 44 are divided into two groups: one group for storing data which are required to be preserved; and the other group for storing data which are not required to be preserved, it becomes difficult to manage these two different types of memory modules installed in one storage device. In an embodiment of the present invention, to avoid the above problem, a memory module has the capability of switching its operation mode between a backup mode and a non-backup mode.

Figure 12:
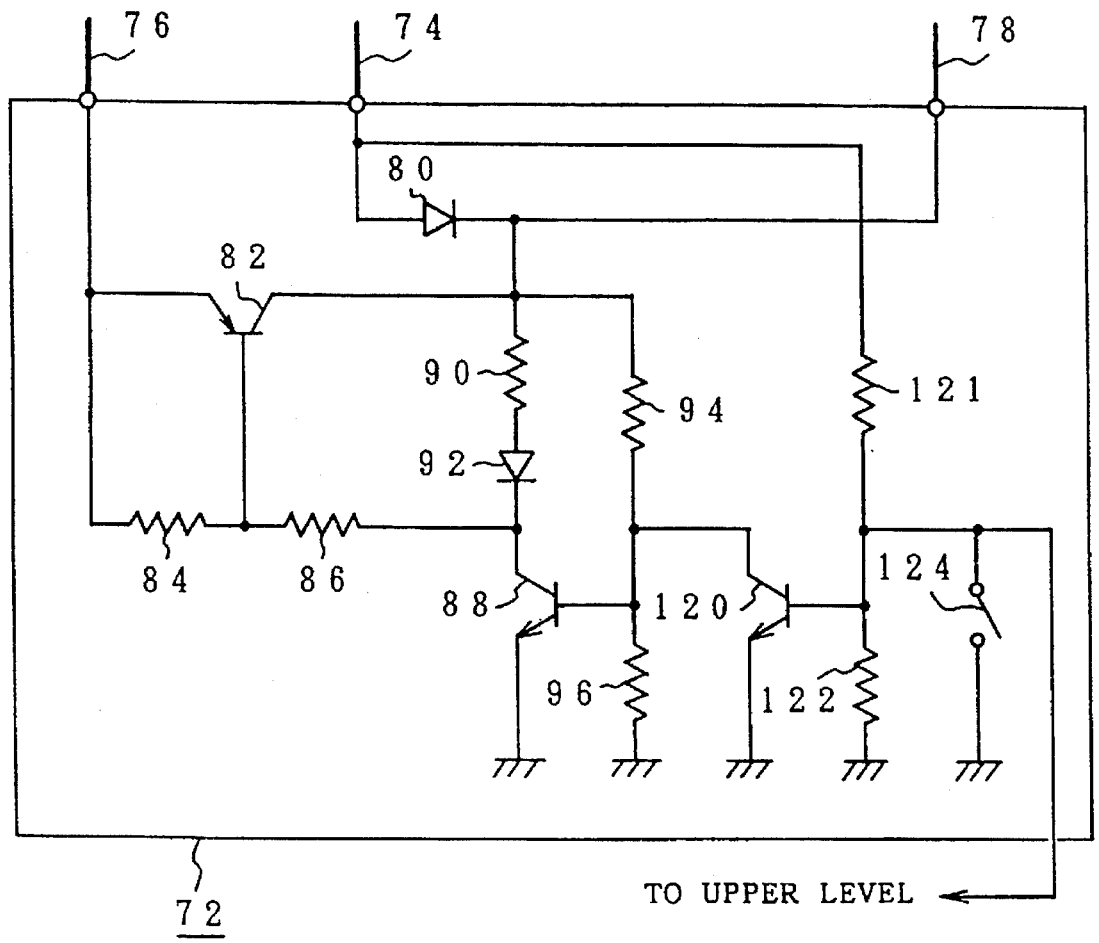
FIG. 12 is a circuit diagram of another embodiment of a backup power supply controller according to the present invention, wherein the backup power supply controller has the capability of selecting a data backup operation mode.

FIG. 12 is a circuit diagram of a backup power supply controller 72 for use in a memory module 44 of the type having the above capability. This backup power supply controller 72 is different from that shown in FIG. 3 in that it has additional elements including a backup selection circuit consisting of a transistor 120 and a resistor 122, and a switch 124 for controlling the backup selection circuit.

The transistor 120 of the backup selection circuit is connected in parallel to the resistor 96 which is connected between the base and emitter of the transistor 88 in the first switching circuit. A voltage obtained by means of voltage division using the resistors 121 and 122 is applied to the base of the transistor 120, wherein the resistors 121 and 122 are connected in series between ground and the power supply terminal connected to the power line 74 so as to apply the power supply voltage to the above resistors connected in series. The switch 124 is connected in parallel to the resistor 122 which is connected between the base and the emitter of the transistor 120. If this switch 124 is turned on, the backup mode is selected. That is, when the switch 124 is turned on, the resistor 122 is short-circuited by the switch 124. This causes the transistor 120 to be cut off, that is, the transistor 120 cannot turn on even when electric power is supplied to the power line 74 from the main power source. Because the transistor 120 is not in an on state, a division voltage obtained via the resistors 94 and 96 connected to the power line 74 is applied to the transistor 88. As a result, the transistor 88 is turned on.

In this situation, if the battery starts to supply electric power to the backup power line 76 in response to a power-off instruction indicating that the main power source should be turned off, the transistor 82 is turned on because the transistor 88 is in the on state. Thus, electric power for the backup operation is transferred from the backup power line 76 to the memory power line 78.

On the other hand, if the switch 124 is in an off state as in the case of FIG. 12, the supply of electric power from the backup power supply is disabled. That is, when the switch 124 is in an off state, a division voltage is obtained via the resistors 121 and 122 connected to the power line 74 to which electric power is supplied from the main power source, and the division voltage is applied to the transistor 120. As a result, the transistor 120 is turned on, and the resistor 96 is short-circuited by the transistor 120. The base voltage of the transistor 88 becomes substantially zero, and therefore the transistor 88 is cut off. When the transistor 88 is in the cut-off state, the transistor 82 remains in an off state even when electric power is supplied from the battery to the backup power line 76, and thus the supply of electric power from the backup power source to the memory power line 78 is disabled. As described above, if the switch 124 provided in the backup power supply controller 72 in the memory module 44 is in the on state, data is backed up, and if the switch 124 is in the off state, the data backup is inhibited.

Furthermore, in the backup power supply controller 72 shown in FIG. 12, the status of the switch 124 is transmitted to an upper level device via a signal line 126. The signal line 126 is at an L-level when the switch 124 is in on state and thus the memory module is in a backup mode on the other hand, the signal line 126 is at an H-level corresponding to the power supply voltage when the switch 124 is in an off state and thus the memory module is in a non-backup mode. Therefore, the upper level device can know which units of a plurality of memory units installed in a system are in a backup mode and which memory units are in a non-backup mode, by detecting the signal level of the signal line 126.

In the embodiment described above in conjunction with FIG. 12, the switch 124 is provided for the purpose of manually selecting the operation mode between backup and non-backup modes. Alternatively, the switch 124 may be replaced by a relay switch of the latch type so that the relay switch is controlled in an on-off fashion by the upper level device. In this case, the selection of the operation mode of the memory units between backup and non-backup modes can be controlled by for example a program that manages the system of the upper level device without the necessity of a manual switching operation.

In the present invention, as described above, when the storage device is in a power-off state in which the main power source is shut off the backup power is supplied only to the memory circuit including the dynamic RAM and there is no necessity of supplying the backup power to the other circuits such as the memory controller, the driver circuit, etc. This allows a great reduction in power consumption during a backup mode operation. Furthermore, when the storage device is in a backup mode, the RAS and CAS signals are firmly fixed at an L-level by connecting the corresponding control signal lines to ground via the pull-down resistors thereby guaranteeing the reliable self-refreshing of the dynamic RAM. Additionally, when the power supply is switched from the main power source to the backup power source, the CAS and RAS signals are lowered in turn a L-level with a predetermined time delay thereby starting a self-refreshing operation of the dynamic RAM. Subsequently, the drivers are disabled and a forced reset operation is performed in response to the falling down of the power supply voltage. The above procedure ensures that the CAS and RAS signals connected to the dynamic RAM are firmly fixed to the L-level via the pull-down resistors.

Furthermore, an additional memory module for memory expansion is installed when the storage device is in a backup mode, supplying of the backup power to the newly installed memory module is inhibited so as to prevent the new memory module from operating in a normal mode which would unnecessarily consume a great amount of battery power. In a case where it is impossible to correctly start a refreshing operation due to some failure in the upper level device after the operation mode has been returned from a backup mode to a main power mode, the dynamic RAM continues the self-refreshing operation in the main power mode until it becomes possible to perform a normal refreshing operation in response to an access of the upper level device thereby preventing the data from being lost, which would otherwise occur due to the failure of the upper level device when the power supply is returned to the main power source.

Although the present invention has been illustrated referring to specific embodiments, the invention is not meant to be limited to the details such as particular values set forth herein, but should be determined by reference to the appended claims and their legal equivalents.

What is claimed is:

1. A storage device comprising:
   a power supply controller for supplying DC power obtained from an AC power source to a main power line in response to a power-on instruction; said power supply controller shutting off power supply to said main power line in response to a power-off instruction after starting to supply DC power from a backup power source to a backup power line, and subsequently outputting a backup instruction signal;
   a memory circuit including a dynamic RAM holding the contents stored in said dynamic RAM by performing refreshing operations repeatedly at predetermined intervals shorter than a maximum allowable limit;
   a memory controller for controlling said dynamic RAM to perform a refreshing operation in response to a refresh instruction signal from an upper level device, and controlling said dynamic RAM to perform a self-refreshing operation in response to said backup instruction signal;
   a driver circuit enabled upon release of said backup instruction signal from said memory controller, and disabled upon giving of said backup instruction signal to said memory controller, wherein, when said driver circuit is enabled, said driver circuit converts a control signal output by said memory controller into a driving signal for driving said dynamic RAM and outputs the driving signal to said memory circuit; and a backup power supply controller having an input connected to said main power line and another input connected to said backup power line, wherein, when electric power is supplied via said main power line to said backup power supply controller, said backup power supply controller outputs the electric power received via said main power line to said memory circuit, and when the power supply is switched from said power line to said backup power line, said backup power supply controller outputs the electric power received via said backup power line to said memory circuit;

said backup power supply controller further inhibits supplying of electric power to said memory circuit when said backup power supply controller receives first electric power via said backup power line.

2. A storage device according to claim 1, wherein said memory controller outputs a disable control signal to said driver circuit to inhibit outputting of control signals to said driver circuit after instructing said driver circuit to start the self-refreshing operation.

3. A storage device according to claim 1, wherein a signal line extending from said driver circuit to said dynamic RAM is grounded via a pull-down resistor.

4. A storage device according to claim 1, further comprising a power supply voltage monitor for monitoring the power supply voltage on said main power line, and outputting a reset signal to said memory controller if said power supply voltage monitor detects that the power supply voltage becomes lower than a predetermined threshold voltage when the power supply to said power line is shut off.

5. A storage device according to claim 4, wherein said driver circuit includes an open collector NAND gate having an input connected to said power supply controller to receive control signals therefrom, the reset signal output by said power supply voltage monitor being connected to another input of said NAND gate, said driver circuit being enabled when the driver control signal applied to said NAND gate is in an enable state or when said reset signal is released from a reset state, and said driver circuit being disabled when said driver control signal is in a disable state or when said reset sinal is in reset state.

6. A storage device according to claim 1, wherein when said memory controller receives said backup instruction signal from said power supply controller when a read or write instruction given by an upper level device is in progress, said memory controller starts a self-refreshing operation of said dynamic RAM according to said backup instruction signal after completing a read or write operation of said dynamic RAM according to said read or write instruction.

7. A storage device according to claim 1, wherein:

when the power supply is returned from said backup power source to said main power source, said power supply controller stops supplying backup power after outputting said backup instruction signal to said memory controller, and when said memory controller receives said backup instruction signal, said memory controller forces said dynamic RAM to continue the self-refreshing operation and then forces said dynamic RAM to stop the self-refreshing operation when said memory controller receives a valid refresh instruction signal issued by said upper level device after said backup instruction signal has been released.

8. A storage device according to claim 1, wherein when said memory controller receives a read or write instruction signal from said upper level device, said memory controller respectively changes a RAS signal and a CAS signal output from said memory controller to said driver circuit, to an L-level in turn with predetermined timing thereby forcing said dynamic RAM to perform a read or write operation.

9. A storage device according to claim 1, wherein when said memory controller receives said backup instruction signal from said power supply controller, said memory controller respectively changes a CAS signal and a RAS signal output from said memory controller to said driver circuit, to an L-level in turn with predetermined timing for predetermined time periods thereby forcing said dynamic RAM to perform a self-refreshing operation.

10. A storage device according to claim 1, wherein said backup power supply controller comprises:

a diode for directly outputting electric power received via said main power line to a memory power line connected to said memory circuit;

a first switching circuit which turns on in response to a power supply voltage applied via said diode;

a second switching circuit which turns on when the power supply via said backup power line is turned on and said first switching circuit is in an on state, thereby outputting electric power received via said backup power line to said memory power line.

11. A storage device according to claim 10, wherein said backup power supply controller further includes a backup selection circuit for selecting whether the backup power is supplied to said memory circuit when the power supply via said main power line is shut off.

12. A storage device according to claim 11, wherein said backup selection circuit comprises:

a selection switching circuit for selecting the backup power line or the main power line to supply electric power to said memory circuit, and a prohibition for prohibiting operation of said first switching circuit when said selection switching circuit is at a second switching position and for allowing the operation of said first switching circuit when said selection switching circuit is at a first switching position.

13. A storage device according to claim 12, wherein said selection switching circuit includes a switch having on and off positions, said switch being mounted on a circuit board.

14. A storage device according to claim 12, wherein said selection switching circuit is a latch relay unit responsive to an instruction signal received from the upper level device.

15. A storage device according to claim 1, wherein:

said memory controller, memory circuit including the dynamic RAM, driver circuit, and backup power circuit are mounted on a single circuit board to form a memory module that is removably installed in an enclosure of said storage device; and said power supply controller is installed in said enclosure as a common module;

and a predetermined number of additional memory modules fit within said enclosure.

16. A storage device according to claim 15, wherein said memory module and said common module form a memory unit, said memory unit being disposed in a semiconductor memory device for use as an external storage device of a computer system.

17. A storage device according to claim 15, wherein said memory module and said common module form a memory unit, said memory unit being disposed in a main memory unit of a computer system.

18. A storage device according to claim 15, wherein said memory module and said common module form a buffer memory unit of a file control unit for controlling various devices.

19. A storage device according to claim 15, wherein said memory module and said common module form a buffer memory unit of a magnetic disk control unit for controlling a magnetic disk drive.

20. A storage device including a dynamic RAM, said storage device comprising:

a power supply controller for supplying DC power to a main power line in response to a power-on instruction, and for shutting off the power supply to said main power line and supplying DC power from a backup power source to a backup power line in response to a power-off instruction;

a memory circuit including a dynamic RAM holding the contents stored in said dynamic RAM by performing refreshing operations;

a memory controller for controlling said dynamic RAM to perform a self-refreshing operation in response to a backup instruction signal from said power supply controller;

a driver circuit enabled upon release of said backup instruction signal from said memory controller, and disabled upon giving of a backup instruction to said memory controller, wherein, when said driver circuit is enabled, said driver circuit converts a control signal output by said memory controller into a driving signal for driving said dynamic RAM and said driver circuit outputs the driving signal to said memory circuit; and a backup power supply controller having an input connected to said main power line and another input connected to said backup power line, said backup power supply controller inhibiting supplying of electric power to said memory circuit when said backup power supply controller receives first electric power via said backup power line.

* * * * *